(12) United States Patent
Veerasamy

(10) Patent No.: US 7,632,538 B2
(45) Date of Patent: *Dec. 15, 2009

(54) METHOD OF MAKING COATING ARTICLE INCLUDING CARBON COATING ON GLASS

(75) Inventor: Vijayen S. Veerasamy, Farmington Hills, MT (US)

(73) Assignee: Guradian Industries Corp., Auburn Hills, MI (US)

( * ) Notice: Subject to any disclaimer, the term of this patent is extended or adjusted under 35 U.S.C. 154(b) by 299 days.

This patent is subject to a terminal disclaimer.

(21) Appl. No.: 11/387,722

(22) Filed: Mar. 24, 2006

(65) Prior Publication Data

US 2006/0166009 A1    Jul. 27, 2006

Related U.S. Application Data

(60) Continuation of application No. 10/682,823, filed on Oct. 10, 2003, now Pat. No. 7,067,175, which is a division of application No. 09/915,552, filed on Jul. 27, 2001, now Pat. No. 6,713,178, which is a division of application No. 09/808,345, filed on Mar. 15, 2001, now Pat. No. 6,303,226, which is a division of application No. 09/303,548, filed on May 3, 1999, now Pat. No. 6,261,693.

(51) Int. Cl.
   *C23C 16/26* (2006.01)
(52) U.S. Cl. .................. 427/154; 427/165; 427/166; 427/249.7; 427/255.7
(58) Field of Classification Search .............. 427/154, 427/165, 166, 249.7, 255.7
See application file for complete search history.

(56) References Cited

U.S. PATENT DOCUMENTS

| | | | |
|---|---|---|---|
| 3,959,577 A | 5/1976 | Frink | |
| 4,060,660 A | 11/1977 | Carlson et al. | |
| 4,273,797 A | 6/1981 | Akashi et al. | |
| 4,400,410 A | 8/1983 | Green et al. | |
| 4,728,529 A | 3/1988 | Etzkorn et al. | |
| 4,746,538 A | 5/1988 | Mackowski | |
| 4,777,090 A | 10/1988 | Ovshinsky et al. | |
| 4,816,291 A | 3/1989 | Desphandey et al. | |
| 4,877,677 A | 10/1989 | Hirochi et al. | |
| 4,935,303 A | 6/1990 | Ikoma et al. | |
| 5,087,608 A * | 2/1992 | Chan et al. ............... | 505/411 |

(Continued)

FOREIGN PATENT DOCUMENTS

EP    0628642 A1 *  12/1994

(Continued)

OTHER PUBLICATIONS

EPO Search Report in counterpart Divisional case, dated Jun. 27, 2003.

(Continued)

*Primary Examiner*—Bret Chen
(74) *Attorney, Agent, or Firm*—Nixon & Vanderhye P.C.

(57) ABSTRACT

A method of making a coated article including a carbon based layer on glass over a low-E coating is provided. Both a low-E coating and a carbon based layer are provided on a glass substrate. The carbon based layer (e.g., DLC) protects the low-E coating.

6 Claims, 4 Drawing Sheets

U.S. PATENT DOCUMENTS

| | | | |
|---|---|---|---|
| 5,122,249 A | 6/1992 | Niemann et al. | |
| 5,135,808 A | 8/1992 | Kimock et al. | |
| 5,188,887 A | 2/1993 | Linge et al. | |
| 5,190,807 A | 3/1993 | Kimock et al. | |
| 5,214,008 A | 5/1993 | Beckwith et al. | |
| 5,229,194 A | 7/1993 | Lingle et al. | |
| 5,240,741 A | 8/1993 | Edwards et al. | |
| 5,240,886 A | 8/1993 | Gulotta et al. | |
| 5,242,560 A | 9/1993 | Lingle et al. | |
| 5,268,217 A * | 12/1993 | Kimock et al. | 428/216 |
| 5,298,048 A | 3/1994 | Lingle et al. | |
| 5,344,718 A | 9/1994 | Hartig et al. | |
| 5,376,455 A | 12/1994 | Hartig et al. | |
| 5,378,527 A | 1/1995 | Nakanishi et al. | |
| 5,385,872 A | 1/1995 | Gulotta et al. | |
| 5,387,433 A * | 2/1995 | Balian et al. | 427/126.3 |
| 5,391,510 A * | 2/1995 | Hsu et al. | 438/301 |
| 5,415,927 A | 5/1995 | Hirayama et al. | |
| 5,425,861 A | 6/1995 | Hartig et al. | |
| 5,425,983 A | 6/1995 | Propst et al. | |
| 5,435,900 A | 7/1995 | Gorokhovsky | |
| 5,455,081 A | 10/1995 | Okada et al. | |
| 5,470,661 A | 11/1995 | Bailey et al. | |
| 5,474,816 A | 12/1995 | Falabella | |
| 5,506,038 A * | 4/1996 | Knapp et al. | 428/216 |
| 5,507,987 A | 4/1996 | Windischmann | |
| 5,508,092 A | 4/1996 | Kimock et al. | |
| 5,508,368 A | 4/1996 | Knapp et al. | |
| 5,510,186 A | 4/1996 | Sulzbach | |
| 5,514,476 A | 5/1996 | Hartig et al. | |
| 5,518,780 A | 5/1996 | Tamor et al. | |
| 5,527,559 A | 6/1996 | Simpson | |
| 5,527,596 A | 6/1996 | Kimock et al. | |
| 5,547,714 A | 8/1996 | Huck et al. | |
| 5,557,462 A | 9/1996 | Hartig et al. | |
| 5,612,262 A | 3/1997 | Kloss et al. | |
| 5,616,179 A | 4/1997 | Baldwin et al. | |
| 5,620,745 A | 4/1997 | Simpson | |
| 5,624,718 A | 4/1997 | Dearnaley | |
| 5,629,532 A | 5/1997 | Myrick | |
| 5,635,245 A | 6/1997 | Kimock et al. | |
| 5,635,258 A | 6/1997 | Chen et al. | |
| 5,637,353 A | 6/1997 | Kimock et al. | |
| 5,643,423 A | 7/1997 | Kimock et al. | |
| 5,653,812 A | 8/1997 | Petrmichl et al. | |
| 5,679,269 A | 10/1997 | Cohen et al. | |
| 5,679,446 A | 10/1997 | Windischmann | |
| 5,688,585 A | 11/1997 | Lingle et al. | |
| 5,736,476 A | 4/1998 | Watzke et al. | |
| 5,747,118 A | 5/1998 | Bunshah et al. | |
| 5,762,715 A | 6/1998 | Patten, Jr. et al. | |
| 5,770,321 A | 6/1998 | Hartig et al. | |
| 5,776,553 A | 7/1998 | Jaffe et al. | |
| 5,776,600 A | 7/1998 | Katayama et al. | |
| 5,776,612 A | 7/1998 | Fisher | |
| 5,776,845 A | 7/1998 | Boulos et al. | |
| 5,776,846 A | 7/1998 | Sakaguchi et al. | |
| 5,783,309 A | 7/1998 | Faure et al. | |
| 5,792,254 A | 8/1998 | Windischmann | |
| 5,795,648 A | 8/1998 | Goel et al. | |
| 5,798,139 A | 8/1998 | Nagashima et al. | |
| 5,800,933 A | 9/1998 | Hartig et al. | |
| 5,821,001 A | 10/1998 | Arbab et al. | |
| 5,824,374 A | 10/1998 | Bradley, Jr. et al. | |
| 5,830,332 A | 11/1998 | Babich et al. | |
| 5,830,812 A | 11/1998 | Shelestak et al. | |
| 5,837,108 A | 11/1998 | Lingle et al. | |
| 5,837,357 A | 11/1998 | Matsuo et al. | |
| 5,844,225 A | 12/1998 | Kimock et al. | |
| 5,846,613 A | 12/1998 | Neuville | |
| 5,846,649 A | 12/1998 | Knapp et al. | |
| 5,849,228 A | 12/1998 | Patton, Jr. et al. | |
| 5,849,413 A | 12/1998 | Zhu et al. | |
| 5,851,940 A | 12/1998 | Boulos et al. | |
| 5,855,641 A | 1/1999 | Taniguchi | |
| 5,858,477 A | 1/1999 | Veerasamy | |
| 5,858,894 A | 1/1999 | Nagashima et al. | |
| 5,858,896 A | 1/1999 | Nagashima et al. | |
| 5,863,605 A | 1/1999 | Bak-Boychuk et al. | |
| 5,873,921 A | 2/1999 | Hirota et al. | |
| 5,877,103 A | 3/1999 | Dupont et al. | |
| 5,879,775 A | 3/1999 | Walter et al. | |
| 5,880,552 A | 3/1999 | McGill et al. | |
| 5,888,593 A | 3/1999 | Petrmichl et al. | |
| 5,939,149 A * | 8/1999 | Jang et al. | 427/535 |
| 5,939,201 A * | 8/1999 | Boire et al. | 428/432 |
| 5,965,216 A | 10/1999 | Neuberger et al. | |
| 5,989,693 A | 11/1999 | Yamasaki et al. | |
| 5,997,943 A | 12/1999 | Azzopardi et al. | |
| 6,001,431 A | 12/1999 | Itoh et al. | |
| 6,002,208 A | 12/1999 | Maishev et al. | |
| 6,030,904 A * | 2/2000 | Grill et al. | 438/781 |
| 6,046,758 A | 4/2000 | Brown et al. | |
| 6,060,178 A | 5/2000 | Krisko | |
| 6,261,693 B1 | 7/2001 | Veerasamy | |
| 6,277,480 B1 | 8/2001 | Veerasamy et al. | |
| 6,280,834 B1 | 8/2001 | Veerasamy et al. | |
| 6,284,377 B1 | 9/2001 | Veerasamy | |
| 6,303,225 B1 | 10/2001 | Veerasamy | |
| 6,303,226 B2 | 10/2001 | Veerasamy | |
| 6,312,808 B1 | 11/2001 | Veerasamy et al. | |
| 6,335,086 B1 | 1/2002 | Veerasamy | |
| 6,338,901 B1 | 1/2002 | Veerasamy | |
| 6,395,333 B2 | 5/2002 | Veerasamy | |
| 6,416,816 B2 | 7/2002 | Veerasamy et al. | |
| 6,472,017 B2 | 10/2002 | Veerasamy et al. | |
| 6,475,573 B1 | 11/2002 | Veerasamy et al. | |
| 6,531,182 B2 | 3/2003 | Veerasamy et al. | |
| 6,621,535 B1 * | 9/2003 | Fukada | 349/40 |
| 6,638,570 B2 | 10/2003 | Veerasamy | |
| 6,663,752 B2 * | 12/2003 | Santilli | 204/164 |
| 6,663,753 B2 * | 12/2003 | Veerasamy et al. | 204/192.11 |
| 6,682,773 B2 | 1/2004 | Medwick et al. | |
| 6,713,178 B2 | 3/2004 | Veerasamy | |
| 6,764,579 B2 | 7/2004 | Veerasamy et al. | |
| 6,827,977 B2 | 12/2004 | Veerasamy | |
| 6,849,328 B1 | 2/2005 | Medwick et al. | |
| 6,878,403 B2 | 4/2005 | Veerasamy et al. | |
| 6,878,404 B2 * | 4/2005 | Veerasamy et al. | 427/249.7 |
| 6,878,405 B2 * | 4/2005 | Bienkiewicz et al. | 427/249.7 |
| 6,887,575 B2 | 5/2005 | Neuman et al. | |
| 6,919,536 B2 | 7/2005 | Veerasamy et al. | |
| 6,936,347 B2 | 8/2005 | Laird et al. | |
| 6,942,923 B2 | 9/2005 | Stachowiak | |
| 7,033,649 B2 * | 4/2006 | Veerasamy | 427/553 |
| 7,067,175 B2 | 6/2006 | Veerasamy | |
| 2003/0064198 A1 | 4/2003 | Thomsen et al. | |
| 2003/0113551 A1 | 6/2003 | Thomsen et al. | |
| 2003/0155065 A1 | 8/2003 | Thomsen et al. | |
| 2005/0153126 A1 | 7/2005 | Finley et al. | |

FOREIGN PATENT DOCUMENTS

| | | |
|---|---|---|
| EP | 0 838 698 | 4/1998 |
| NL | 8800607 | 10/1989 |
| WO | WO 94/12680 | 6/1994 |
| WO | WO 98/26926 | 6/1998 |
| WO | WO 98/45847 | 10/1998 |

OTHER PUBLICATIONS

"Surface Hardening of Ceramic and Glass Material" IBM Corp. 1993, vol. 36, No. 03, Mar. 1993.

"6001 Chemical Abstracts". Columbus. Ohio (1996) 1pg.

"Highly Tetrahedral, Diamond-Like Amorphous Hydrogenated Carbon Prepared From a Plasma Beam Source". Sattel et al.. Published Feb. 1994 pp. 2797-2799.

"Deposition of Carbon Films by a Filtered Cathodic Arc". Kunn et al.. Jan. 1993. pp. 1350-1354.

"Electronic Density of States in Highly Tetrahedral Amorphous Carbon", Veerasamy et al., Aug. 1993, pp. 319-326.

"Preparation and Properties of Highly Tetrahedral Hydrogenated Amorpnous Carbon", Weiler et al., Jan. 1996, pp. 1594-1607.

"Optical and Electronic Properties of Amorphous Diamond". Veerasamy et al.. Feb. 1993. pp. 782-787.

"IBM Tech. Bulletin". vol. 36. No. 3 (1993) 1pg.

"IBM Tech. Bulletin". vol. 36. No. 1 (1993) 1pg.

"Tetrahedral Amorphous Carbon Deposition, Characterisation and Electronic Properties", Veerasamy, Univ. of Cambridge, Jul. 1994.

"The Fracturing of Glass" By Michalses, et. al.

US 4,960,645, 10/1990, Lingle et al. (withdrawn)

* cited by examiner

METHOD OF MAKING COATING ARTICLE INCLUDING CARBON COATING ON GLASS

This application is a continuation of Ser. No. 10/682,823, filed Oct. 10, 2003, now U.S. Pat. No. 7,067,175 which is a division of Ser. No. 09/915,552, filed Jul. 27, 2001 (now U.S. Pat. No. 6,713,178), which is a division of Ser. No. 09/808,345, filed Mar. 15, 2001 (now U.S. Pat. No. 6,303,226), which is a division of Ser. No. 09/303,548, filed May 3, 1999 (now U.S. Pat. No. 6,261,693), the disclosures of which are all hereby incorporated herein by reference.

This invention relates to a diamond-like carbon (DLC) coating provided on (directly or indirectly) a glass or other substrate. More particularly, in certain preferred embodiments, this invention relates to a highly tetrahedral amorphous diamond like carbon coating on a soda inclusive glass substrate (e.g. on a soda lime silica glass substrate) for purposes of repelling water and/or reducing corrosion on the coated article. Ion beam and filtered carbon cathodic arc deposition are preferred methods of deposition for the coating.

BACKGROUND OF THE INVENTION

Soda inclusive glasses are known in the art. For example, see U.S. Pat. No. 5,214,008, which is hereby incorporated herein by reference.

Soda lime silica glass, for example, is used for architectural glass, automotive windshields, and the like. The aforesaid '008 patent discloses one type of soda lime silica glass known in the art.

Unfortunately, conventional soda inclusive glasses are susceptible to environmental corrosion which occurs when sodium (Na) diffuses from or leaves the glass interior. This sodium, upon reaching the surface of the glass, may react with water to produce visible stains or smears (e.g. stains of sodium hydroxide) on the glass surface. Such glasses are also susceptible to retaining water on their surfaces in many different environments, including when used as automotive windows (e.g. backlites, side windows, and/or windshields). These glasses are also susceptible to fogging up on the interior surface thereof in automotive and other environments.

In view of the above, it is apparent that there exists a need in the art to prevent and/or minimize visible stains/corrosion on soda inclusive coated glass surfaces. There also exists a need in the art to provide a strong protective coating on window substrates. Other needs in the art include the need for a coating on glass that reduces the coated article's susceptibility to fogging up in automotive and other environments, and the need for a coated glass article that can repel water and/or dirt.

It is known to provide diamond like carbon (DLC) coatings on glass. U.S. Pat. No. 5,637,353, for example, states that DLC may be applied on glass. The '353 patent teaches that because there is a bonding problem between glass and that type of DLC, an intermediate layer is provided therebetween. Moreover, the '353 patent does not disclose or mention the highly tetrahedral amorphous type of DLC used in many embodiments set forth below. The DLC of the '353 patent would not be an efficient corrosion minimizer on glass in many instances due to its low density (likely less than 2.0 gm/cm$^3$). Still further, the DLC of the '353 patent is deposited in a less than efficient manner for certain embodiments of this invention.

It is known that many glass substrates have small cracks defined in their surface. The stress needed to crack glass typically decreases with increasing exposure to water. When water enters such a crack, it causes interatomic bonds at the tip of the crack to rupture. This weakens glass. Water can accelerate the rate of crack growth more than a thousand times by attacking the structure of the glass at the root or tip of the crack. Strength of glass is in part controlled by the growth of cracks that penetrate the glass. Water, in these cracks, reacts with glass and causes it to crack more easily as described in "The Fracturing of Glass," by T. A. Michalske and Bruce C. Bunker, hereby incorporated herein by reference. Water molecules cause a concerted chemical reaction in which a silicon-oxygen bond (of the glass) at the crack tip and on oxygen-hydrogen bond in the water molecule are both cleaved, producing two silanol groups. The length of the crack thus increases by one bond rupture, thereby weakening the glass. Reaction with water lowers the energy needed to break the silicon-oxygen bonds by a factor of about 20, and so the bond-rupture allows glass cracks to grow faster.

Thus, there also exists a need in the art for preventing water from reaching silicon-oxygen bonds at tips of cracks in a glass substrate, so as to strengthen the glass.

It is a purpose of different embodiments of this invention to fulfill any or all of the above described needs in the art, and/or other needs which will become apparent to the skilled artisan once given the following disclosure.

SUMMARY OF THE INVENTION

An object of this invention is to provide a coated article that can shed water (e.g. automotive windshield, automotive backlite, automotive side window, architectural window, etc.).

Another object of this invention is to provide a system or means for reducing or minimizing corrosion on soda inclusive coated glass articles.

Another object of this invention is to provide a coated glass article wherein a DLC coating protects the glass from acids such as HF, nitric, and sodium hydroxide (the coating may be chemically inert).

Another object of this invention is to provide a coated glass article that is not readily susceptible to fogging up.

Another object is to provide a barrier layer with no pin holes on a glass substrate.

Another object of this invention is to provide a coated glass article that is abrasion resistant, and/or can repel dirt and the like.

Another object of this invention is to provide a glass substrate with a DLC coating inclusive of a highly tetrahedral dense amorphous carbon layer, either in direct or indirect contact with the substrate.

Another object of this invention is to provide a DLC coating on a substrate, wherein the coating includes different portions or layers with different densities and different sp$^3$ carbon-carbon bond percentages. The ratio of sp$^3$ to sp$^2$ carbon-carbon bonds may be different in different layers or portions of the coating. Such a coating with varying compositions therein may be continuously formed by varying the ion energy used in the deposition process so that stresses in the coating are reduced in the interfacial portion/layer of the DLC coating immediately adjacent the underlying substrate. Thus, a DLC coating may have therein an interfacial layer with a given density and sp$^3$ carbon-carbon bond percentage, and another layer with a higher density and higher sp$^3$ carbon-carbon bond percentage.

Generally speaking, this invention fulfills certain of the above described needs/objects in the art by providing a coated glass comprising:

a glass substrate including at least about 5% by weight soda/$Na_2O$;

an amorphous carbon layer provided on the glass substrate in order to reduce corrosion or stains on the coated glass, wherein said amorphous carbon layer includes $sp^2$ and $sp^3$ carbon-carbon bonds; and wherein the amorphous carbon layer has more $sp^3$ carbon-carbon bonds than $sp^2$ carbon-carbon bonds.

In other embodiments, this invention fulfills certain of the above described needs in the art by providing a coated glass comprising:

a soda inclusive glass substrate comprising, on a weight basis, from about 60-80% $SiO_2$, from about 10-20% $Na_2O$, from about 0-16% CaO, from about 0-10% $K_2O$, from about 0-10% MgO, and from about 0-5% $Al_2O_3$; and a non-crystalline diamond-like carbon (DLC) coating provided on the glass substrate, wherein the DLC coating includes at least one highly tetrahedral amorphous carbon layer having at least about 35% $sp^3$ carbon-carbon bonds.

In certain embodiments, the glass substrate is a soda lime silica float glass substrate.

In preferred embodiments, the entire DLC coating or alternatively only a layer within the DLC coating, has a density of from about 2.4 to 3.4 gm/$cm^3$, most preferably from about 2.7 to 3.0 gm/$cm^3$.

In certain embodiments, the tetrahedral amorphous carbon layer has the aforesaid density range and includes at least about 70% $sp^3$ carbon-carbon bonds, and most preferably at least about 80% $sp^3$ carbon-carbon bonds.

In certain embodiments, the DLC coating includes a top layer (e.g. from about 2 to 8 atomic layers, or less than about 20 Å) that is less dense than other portions of the DLC coating, thereby providing a solid lubricant portion at the top surface of the DLC coating. Layered graphene connected carbon atoms are provided in this thin layer portion. The coefficient of friction is less than about 0.1 for this thin layer portion.

Another advantage of this invention is that the temperature of the glass substrate is less than about 200° C., preferably less than about 150° C., most preferably from about 60-80° C., during the deposition of DLC material. This is to minimize graphitization during the deposition process.

This invention further fulfills the above described needs in the art by providing a window having a substrate and a highly tetrahedral amorphous carbon layer thereon, wherein the substrate is or includes at least one of borosilicate glass, soda lime silica glass, and plastic.

This invention will now be described with respect to certain embodiments thereof, along with reference to the accompanying illustrations.

IN THE DRAWINGS

DETAILED DESCRIPTION OF CERTAIN EMBODIMENTS OF THIS INVENTION

Figure 1:
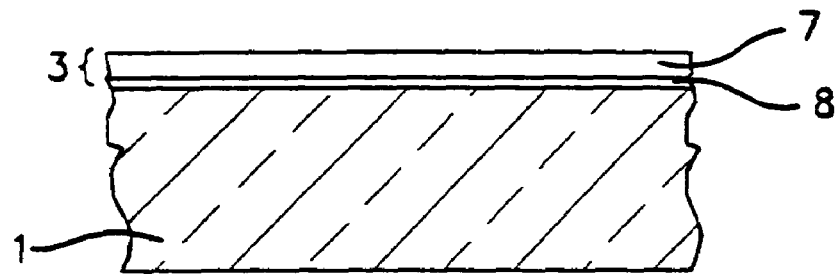
FIG. 1 is a side cross sectional view of a coated article according to an embodiment of this invention, wherein a substrate is provided with a DLC coating including at least two layers therein.

Referring now more particularly to the accompanying drawings in which like reference numerals indicate like elements throughout the accompanying views.

FIG. 1 is a side cross sectional view of a coated glass article according to an embodiment of this invention, wherein at least one diamond-like carbon (DLC) protective coating(s) 3 is provided directly on soda-inclusive glass substrate 1. DLC coating 3 in the FIG. 1 embodiment includes at least one highly tetrahedral amorphous carbon (ta—C) layer 7 that has a high density (e.g. greater than about 2.4 grams per cubic centimeter) and functions to repel water and seal soda within the soda inclusive glass substrate. Coating 3 further includes at least one interfacing layer 8 directly adjacent substrate 1, where layer 8 has a lesser density and a lesser percentage of $sp^3$ carbon-carbon bonds than ta—C layer 7. Even though layer 8 differs from layer 7 in these manner(s), interfacing layer 8 may or may not qualify as ta—C with a density of at least about 2.4 gm/$cm^3$, as described below. It is noted that in certain embodiments, coating 3 may include multiple ta—C layers 7 and/or multiple layers 8. Layers 7 and 8 of the coating may be formed in a continuous or non-continuous deposition process in different embodiments of this invention.

Figure 2:
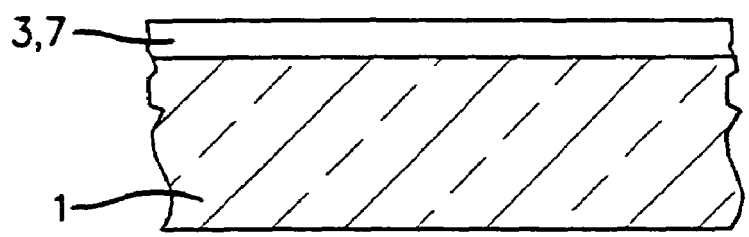
FIG. 2 is a side cross sectional view of a coated article according to another embodiment of this invention, wherein a highly tetrahedral amorphous carbon DLC coating is provided on and in contact with a substrate.

FIG. 2 is a side cross sectional view of a coated glass article according to another embodiment of this invention, wherein at least one DLC coating(s) 3 is provided on glass substrate 1. In the FIG. 2 embodiment, substantially the entire DLC coating 3 is made up of highly tetrahedral amorphous carbon (ta—C), similar to layer 7, having a density of at least about 2.4 grams per cubic centimeter and a high percentage (e.g. at least about 35%, more preferably at least about 70%, and most preferably at least about 80%) of $sp^3$ carbon-carbon bonds. In other words, ta—C layer 7 from the FIG. 1 embodiment forms the entirety of DLC coating 3 in the FIG. 2 embodiment. DLC coating 3 in the FIG. 2 embodiment may or may not have equal densities and/or the same percentages of $sp^3$ carbon-carbon bonds throughout the thickness of coating 3, as these parameters may be varied throughout layers 3, 7 and 8 in the FIGS. 1 and 2 embodiments by changing the ion energy used during the deposition process of coating 3.

Figure 3:
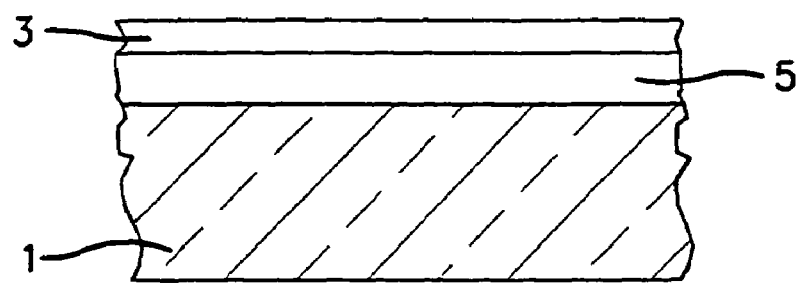
FIG. 3 is a side cross sectional view of a coated article according to yet another embodiment of this invention wherein a low-E or other coating is provided on a substrate, with the DLC coating of either of the FIG. 1 or FIG. 2 embodiments also on the substrate but over top of the intermediate low-E or other coating.

In the FIG. 3 embodiment, a low-E or other coating 5 is provided between substrate 1 and DLC coating 3 (i.e. the DLC coating of either the FIG. 1 or FIG. 2 embodiment). However, DLC coating 3 is still on substrate 1 in the FIG. 3 embodiment, along with a ta—C portion 7 of coating 3. Thus, the term "on" herein means that substrate 1 supports DLC coating 3 or any layer (e.g. 7, 8) thereof, regardless of whether or not other layer(s) 5 are provided therebetween. Thus, protective coating 3 may be provided directly on substrate 1 as shown in FIGS. 1-2, or may be provided on substrate 1 with a low-E or other coating(s) 5 therebetween as shown in FIG. 3.

Coating 5, instead of its illustrated position in FIG. 3, may also be provided on top of DLC coating 3 so that coating 3 (of either the FIG. 1 or FIG. 2 embodiment) is located between coating(s) 5 and substrate 1. In still other embodiments, a DLC coating 3 may be provided on both sides of a low-E coating 5.

Exemplar coatings (in full or any portion of these coatings) that may be used as low-E or other coating(s) 5, either on top of or below DLC coating 3, are shown and/or described in any of U.S. Pat. Nos. 5,837,108, 5,800,933, 5,770,321, 5,557,462, 5,514,476, 5,425,861, 5,344,718, 5,376,455, 5,298,048, 5,242,560, 5,229,194, 5,188,887 and 4,960,645, which are all hereby incorporated herein by reference. Simple silicon oxide and/or silicon nitride coating(s) may also be used as coating(s) 5.

As will be discussed in more detail below, highly tetrahedral amorphous carbon (ta—C) layer(s) 7 is a special form of diamond-like carbon (DLC), and includes at least about 35% $sp^3$ carbon-carbon bonds (i.e. it is highly tetrahedral). In certain embodiments of this invention, ta—C layer(s) 7 has at least about 35% $sp^3$ carbon-carbon bonds of the total sp bonds in the layer, more preferably at least about 70%, and most preferably at least about 80% $sp^3$ carbon-carbon bonds so as to increase the density of layer 7 and its bonding strength. The amounts of $sp^3$ bonds may be measured using Raman fingerprinting and/or electron energy loss spectroscopy. The high amount of $sp^3$ bonds increases the density of layer thereby allowing it to prevent soda diffusion to the surface of the coated article.

Ta—C layer 7 forms the entirety of DLC coating 3 in the FIG. 2 embodiment, and ta—C layer 7 forms only a portion of DLC coating 3 in the FIG. 1 embodiment. This is because interfacial amorphous carbon layer 8 in the FIG. 1 embodiment sometimes has a density less than about 2.4 grams per cubic centimeter and/or less than about 35% $sp^3$ carbon-carbon bonds. However, it is noted that DLC coating 3 has an interfacial layer immediately adjacent substrate 1 in each of the FIG. 1 and FIG. 2 embodiments, with the difference being that the interfacial layer in the FIG. 2 embodiment has a density of at least about 2.4 grams per cubic centimeter and at least about 35% $sp^3$ (more preferably at least about 70%, and most preferably at least about 80%) carbon-carbon bonds. Thus, layer 7 herein refers to both layer 7 as illustrated in the FIG. 1 embodiment as well as DLC coating 3 in the FIG. 2 embodiment.

At least some carbon atoms of DLC coating 3, and/or some $sp^2$ and/or $sp^3$ carbon-carbon bonds, are provided in fissures or cracks in a surface (e.g. top surface) of the glass substrate, or may penetrate the glass surface of substrate 1 itself or the surface of growing DLC, so as to strongly bond coating 3 to substrate 1. Subimplantation of carbon atoms into the surface of substrate 1 enables coating 3 to be strongly bonded to substrate 1.

Figure 4:
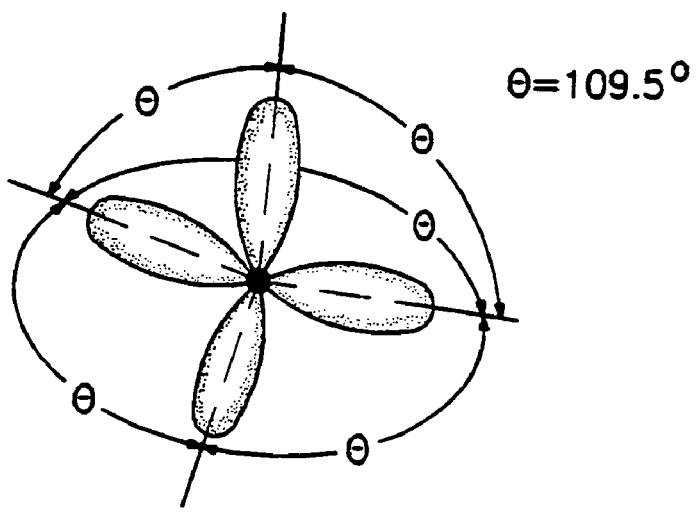
FIG. 4 illustrates an exemplar $sp^3$ carbon atom hybridization bond.
Figure 5:
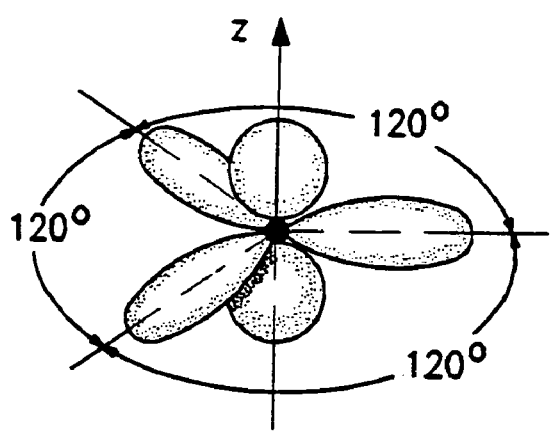
FIG. 5 illustrates an exemplar $sp^2$ carbon atom hybridization bond.
Figure 6:
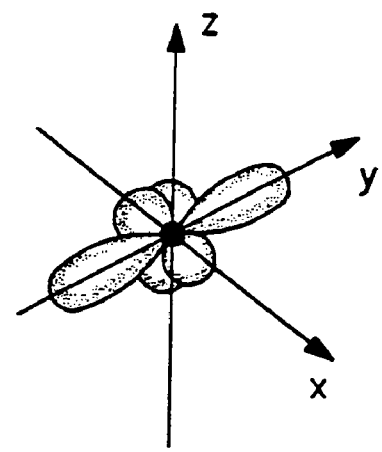
FIG. 6 illustrates exemplar sp hybridizations of a carbon atom.

For purposes of simplicity, FIG. 4 illustrates an exemplar $sp^3$ carbon-carbon or C—C bond (i.e. carbon to carbon diamond like bond) in coating 3, FIG. 4 an exemplar $sp^2$ C—C bond in coating 3, and FIG. 5 an exemplar sp.

The provision of dense (density of at least about 2.4 $gm/cm^3$) ta—C layer 7 on soda inclusive glass substrate 1 reduces the amount of soda which can exit the substrate or reach the surface of the substrate or coated article (i.e. ta—C limits sodium diffusion from the substrate). Thus, less soda is allowed to react with water or other material(s) on the surface of the article. The end result is that the provision of ta—C layer 7 on the substrate reduces stains and/or corrosion on the glass article which can form over time. The large number of $sp^3$ carbon-carbon bonds increases the density of layer 7 and allows the layer to repel water and minimize soda diffusion from soda inclusive glass.

Coating(s) 3, and layer(s) 7, 8, also strengthen the glass article, reduce stress at the bonding surfaces between coating 3 and substrate 1, and provide a solid lubricant surface on the article when coating 3 is located at a surface of the article. Coating(s) 3 and/or layer 7 may includes a top layer portion (e.g. the top 3 to 15 Å) that is less dense than central areas of coating 3, thereby is providing a solid lubricant at the top surface of coating 3 furthest from the substrate so that the article is resistant to scratching. Ta—C layer 7 also provides resistance to water/moisture entering or coming into substrate 1. Coating 3, and thus ta—C layer 7, are preferably formed/deposited continuously across glass substrate 1, absent any pinholes or apertures.

Figure 8:
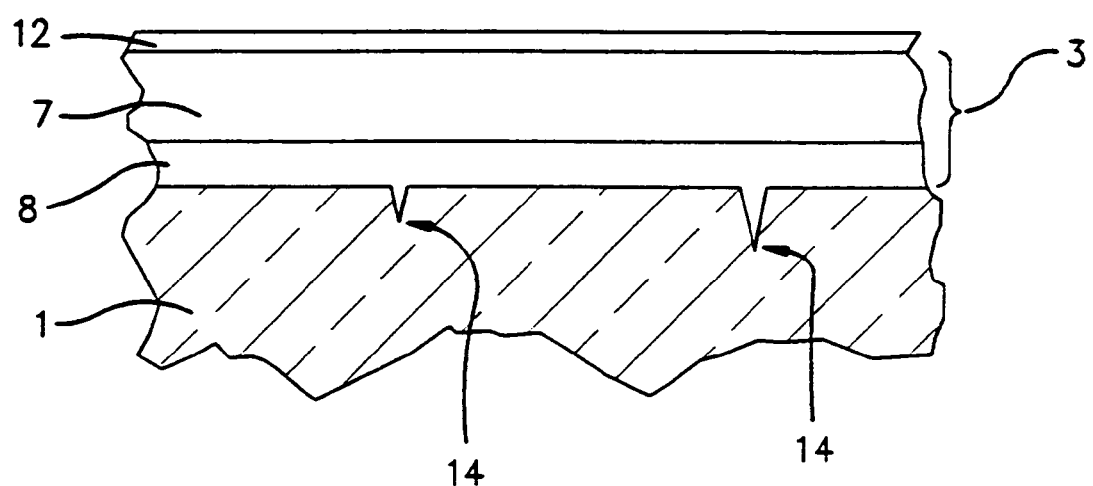
FIG. 8 is a side cross sectional view of a coated glass substrate according to an embodiment of this invention, illustrating DLC bonds penetrating cracks in the surface of a glass substrate.

In certain embodiments, layer 7 and/or 8 adjacent the glass substrate is deposited at an ion energy that allows significant numbers of carbon atoms to penetrate cracks in the glass surface as shown in FIG. 8. The small size of carbon atoms and the ion energy utilized prevent substantial water from reaching the tip of the crack(s). This strengthens the glass in the long term by slowing down and/or stopping the rupture of silicon-oxygen bonds at crack tips caused by water exposure.

Advantages associated with certain embodiments of this invention include: (i) coated window articles that can shed water in different environments (e.g. automotive windows such as backlites and windshields, or commercial and residential windows); (ii) anti-fog coated articles that are resistant to fogging up; (iii) strengthened coated windows; (iv) abrasion resistant coated windows; (v) coated articles that can repel dirt; and (vi) coated glass articles less susceptible to visible corrosion on surfaces thereof. For example, in automotive window embodiments, the outer surface of substrate 1 exposed to the environment is coated with coating 3 in accordance with any of the FIG. 1-3 embodiments. In anti-fog automotive embodiments, the inner surface of automotive window substrates 1 may be coated with coating 3 in accordance with any of the FIG. 1-3 embodiments.

In certain embodiments, coating 3 is at least about 70% transparent to or transmissive of visible light rays, preferably at least about 80%, and most preferably at least about 90% transparent to visible light rays.

In certain embodiments, DLC coating 3 (and thus layer 7 in the FIG. 2 embodiment) may be from about 30 to 3,000 Å thick, most preferably from about 50 to 300 Å thick. As for glass substrate 1, it may be from about 1.5 to 5.0 mm thick, preferably from about 2.3 to 4.8 mm thick, and most preferably from about 3.7 to 4.8 mm thick. Ta—C layer 7, in certain embodiments, has a density of at least about 2.4 grams per cubic centimeter, more preferably from about 2.4 to 3.4 $gm/cm^3$, and most preferably from about 2.7 to 3.0 $gm/cm^3$.

Substrate 1 includes soda or $Na_2O$ in certain embodiments of this invention. Thus, ta—C layer(s) 7 minimize the amount of soda that can reach the surface of the coated article and cause stains/corrosion. In certain embodiments, substrate 1 includes, on a weight basis, from about 60-80% $SiO_2$, from about 10-20% $Na_2O$, from about 0-16% CaO, from about 0-10% $K_2O$, from about 0-10% MgO, and from about 0-5% $Al_2O_3$. In certain other embodiments, substrate 1 may be soda lime silica glass including, on a weight basis, from about 66-75% $SiO_2$, from about 10-20% $Na_2O$, from about 5-15% CaO, from about 0-5% MgO, from about 0-5% $Al_2O_3$, and from about 0-5% $K_2O$. Most preferably, substrate 1 is soda lime silica glass including, by weight, from about 70-74% $SiO_2$, from about 12-16% $Na_2O$, from about 7-12% CaO, from about 3.5 to 4.5% MgO, from about 0 to 2.0% $Al_2O_3$, from about 0-5% $K_2O$, and from about 0.08 to 0.15% iron oxide. Soda lime silica glass according to any of the above embodiments may have a density of from about 150 to 160 pounds per cubic foot (preferably about 156), an average short term bending strength of from about 6,500 to 7,500 psi (preferably about 7,000 psi), a specific heat (0-100 degrees C.) of about 0.20 Btu/lbF, a softening point of from about 1330 to 1345 degrees F., a thermal conductivity of from about 0.52 to 0.57 Btu/hrftF, and a coefficient of linear expansion (room temperature to 350 degrees C.) of from about 4.7 to $5.0 \times 10^{-6}$ degrees F. In certain embodiments, any glass disclosed in U.S. Pat. No. 5,214,008 or U.S. Pat. No. 5,877,103, each incorporated herein by reference, may be used as substrate 1. Also, soda lime silica float glass available from Guardian Industries Corp., Auburn Hills, Mich., may be used as substrate 1.

Any such aforesaid glass substrate 1 may be, for example, green, blue or grey in color when appropriate colorant(s) are provided in the glass.

In certain other embodiments of this invention, substrate 1 may be of borosilicate glass, or of substantially transparent plastic. In certain borosilicate embodiments, the substrate 1 may include from about 75-85% $SiO_2$, from about 0-5% $Na_2O$, from about 0 to 4% $Al_2O_3$, from about 0-5% $K_2O$, from about 8-15% $B_2O_3$, and from about 0-5% $Li_2O$.

In still further embodiments, an automotive window (e.g. windshield or side window) including any of the above glass substrates laminated to a plastic substrate may combine to make up substrate 1, with the coating 3 of any of the FIGS. 1-3 embodiments provided on either or both sides of such a window. Other embodiments would have substrate 1 made up of a sheet of soda lime silica glass laminated to a plastic sheet for automotive window purpose, with coating(s) 3 of any of the FIG. 1-3 embodiments on the inner side of the substrate bonded to the plastic. In other embodiments, substrate 1 may include first and second glass sheets of any of the above mentioned glass materials laminated to one another, for use in window (e.g. automotive windshield, residential window, commercial window, automotive side window, automotive backlite or back window, etc.) and other similar environments.

In certain embodiments, coating 3 and/or ta—C layer 7 may have an average hardness of from about 30-80 GPa (most preferably from about 40-75 GPa), and a bandgap of from about 1.8 to 2.2 eV. It is noted that the hardness and density of coating 3 and/or layers 7, 8 thereof may be adjusted by varying the ion energy of the depositing apparatus or process described below.

When substrate 1 of any of the aforesaid materials is coated with at least DLC coating 3 according to any of the FIGS. 1-3 embodiments, the resulting coated article has the following characteristics in certain embodiments: visible transmittance (Ill. A) greater than about 60% (preferably greater than about 70%), UV (ultraviolet) transmittance less than about 38%, total solar transmittance less than about 45%, and IR (infrared) transmittance less than about 35% (preferably less than about 25%, and most preferably less than about 21%). Visible, "total solar", UV, and IR transmittance measuring techniques are set forth in U.S. Pat. No. 5,800,933, as well as the '008 patent, incorporated herein by reference.

Diamond-like carbon (DLC) and the special tetrahedral amorphous carbon (ta—C) form 7 of DLC utilized in certain embodiments herein will now be described in detail. All DLC 3 shown in drawings herein is amorphous. Ta—C 7 is amorphous and yet has substantial C—C tetrahedral ($sp^3$-type) bonding and hence is termed tetrahedral amorphous carbon (ta—C) [or highly ta—C] as it has at least 35% $sp^3$ C—C bonds, preferably at least about 70% and most preferably at least about 80% $sp^3$ C—C bonds. Diamond-like bonding gives this ta—C material gross physical properties approaching those of diamond such as high hardness, high density and chemical inertness. However, ta—C also includes $sp^2$ C—C trigonal bonding and its optical and electronic properties are largely determined by this bonding component. The fraction of $sp^2$ bonding, and thus the density, in a ta—C layer depends for example on the carbon ion energy used during deposition of coating 3 and/or layers 7 and 8. Properties of a given DLC coating are a function of the fraction of $sp^3$ to $sp^2$ bonding throughout the coating and thus throughout layers 7 and 8.

It is noted that the $sp^3$ bonds discussed herein are $sp^3$ carbon-carbon bonds which result in a high density coating 3 and/or 7 and are not $sp^3$ carbon-hydrogen bonds which do not provide as high of density.

Depending on the technique of deposition, many ta—C layers 7 herein contain amounts of H (up to about 4%) which either include the C atom to take either a tetrahedral configuration or an $sp^2$ planar configuration or to be sp-hybridised within a linear polymeric-like form. In other words C—C, C—H and H—H correlations all contribute to the is average structure of layers 7 in some embodiments.

In the case of ta—C which is fully or at least about 90% hydrogen-free, C—C bonding describes the local structure. Ta—C films also have some fraction of $sp^2$ or graphic bonding. The spatial distribution of trigonal ($sp^2$) and tetrahedral carbon atoms may determine the bonding strength of layer(s) 3 to glass, as well as the layer's density, strength, stress, etc. Tetrahedral amorphous carbon (ta—C) and its hydrogenated form ta—C:H (which contains no more than about 10 at % or so H) have the highest percentage of carbon-carbon (C—C) $sp^3$ bonding, and are used as layer 7 in the FIG. 1 embodiment and coating 3 in the FIG. 2 embodiment, and either of these in the FIG. 3 embodiment. This diamond-like bonding confers upon ta—C 7 properties which are unrivaled by other forms of so called DLC which have lower densities and/or greater proportion of graphitic $sp^2$ and polymeric sp C—C and C—H bonding.

Ta—C 7 has high density (at least about 2.4 grams per cubic centimeter), hardness, Young's modulus (700-800), as well as a low coefficient of friction (see Table 1 below).

TABLE 1

| Properties | c-Diamond | ta-C | ta-C:H (10% at H) |
|---|---|---|---|
| Bandgap (eV) | 5.45 | 2.0 | 2.2-2.5 |
| Breakdown voltage (V cm-1) 10^5 | 100 | 25-35 | 30 |
| Dielectric Constant | 5.5 | 4.5 | 4.7 |
| Resistivity (ohm-cm) | $10^{18}$ | $10^{11}$ | $10^{12}$ |
| Thermal Conductivity ($Wcm^{-1}K^{-1}$) | 20 | 0.1 | 0.1 |
| Young's modulus Gpa | 1000 | 700-800 | 500 |
| Hardness (Gpa) | 100 | 30-80 | 5-80 |
| Refractive index | 2.4 | 2.0 | 1.6-1.9 |
| Structure | crystalline | amorphous | amorphous |
| Deposition condition/rate | high temp CVD 0.1 um/hr | low temp <200 C. 20 A/s | low temp |
| wetability | | contact angle 5 to 50 | |
| Max thickness | >1 um | <200 nm stress limited | <200 nm |
| Coefficient of Friction | <0.2 single crystal | <0.1 | <0.1 |

Methods of depositing coating 3 on substrate 1 are described below for certain embodiments of this invention.

Prior to coating 3 being formed on the glass substrate, the top surface of substrate 1 is preferably cleaned by way of an ion beam utilizing oxygen gas in each of the FIGS. 1 and 2 embodiments. Oxygen gas physically cleans the surface due to its atomic weight of from about 28-40 amu, most preferably about 32. Substrate 1 may also be cleaned by, for example, sputter cleaning the substrate prior to actual deposition of ta—C or other DLC material. This cleaning may utilize oxygen and/or carbon atoms, and can be at an ion energy of from about 800 to 1200 eV, most preferably about 1,000 eV.

Figure 7:
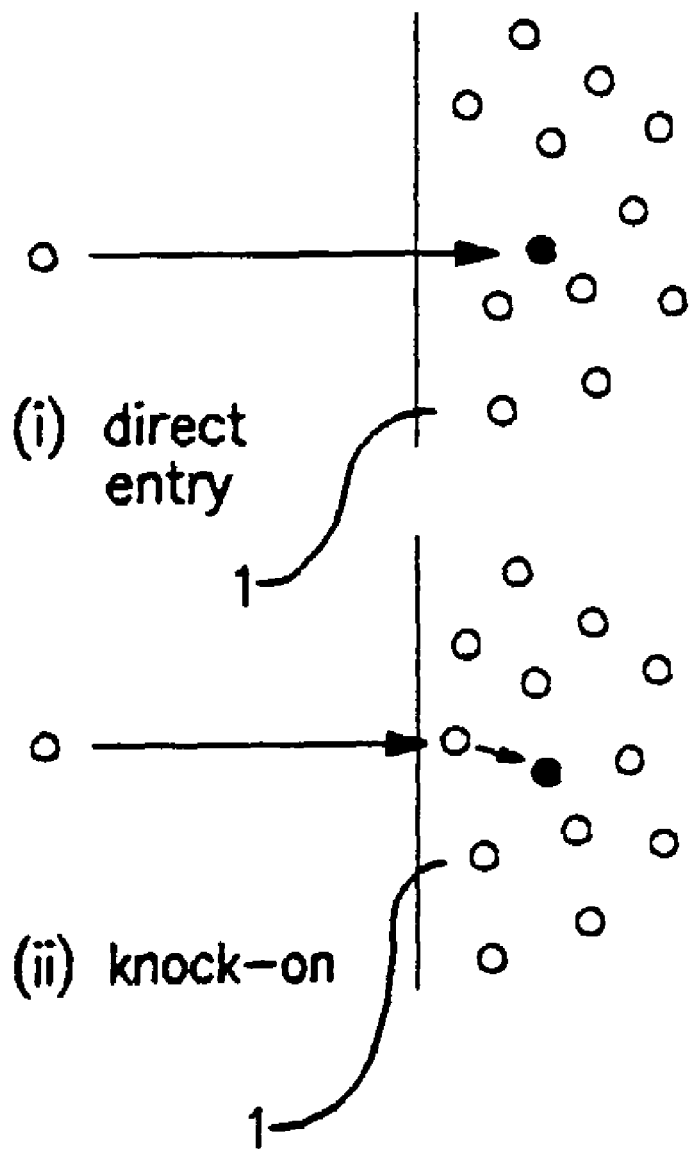
FIG. 7 is a side cross sectional view of carbon ions penetrating the substrate or DLC surface so as to strongly bond a DLC layer according to any embodiment herein.

In plasma ion beam embodiments for depositing coatings 3, 7 and/or 8, carbon ions may be energized to form a stream from plasma toward substrate 1 so that carbon from the ions is deposited on substrate 1. An ion beam from gas phase produces a beam of C+, CH+, $C_2H$, and/or $C_2H_2$+ ions (i.e. carbon or carbon based radicals). Preferably, acetylene feedstock gas ($C_2H_2$) is used to prevent or minimize polymerization and to obtain an appropriate energy to allow the ions to penetrate the substrate 1 surface and subimplant therein, thereby causing coating 3 atoms to intermix with the surface of substrate 1 a few atom layers thereinto. Impact energy of ions for the bulk of coating 3 (e.g. layer 7 in the FIGS. 1 and 2 embodiments) may be from about 100 to 200 eV per carbon atom, preferably from about 100-150 eV, to cause dense $sp^3$ C—C bonds to form in the DLC layer. The ions impact the substrate with this energy which promotes formation of $sp^3$ carbon-carbon bonds. The impact energy of the energetic carbon ions may be within a range to promote formation of the desired lattice structure, such bonds in an interfacing portion (e.g. layer 8 in the FIG. 1 embodiment) of coating 3 apparently being formed at least in part by subimplantation into the substrate as shown in FIG. 7. The stream may be optionally composed of ions having approximately uniform weight, so that impact energy will be approximately uniform. Effectively, the energetic ions impact on the growing film surface and/or substrate 1 and are driven into the growing film and/or substrate 1 to cause densification. Coating 3, and especially layer 7, are preferably free of pinholes, to achieve satisfactory water repulsion and suppression of soda diffusion.

Thus, the C—C $sp^3$ bonding is preferably formed by having a predetermined range of ion energy prior to reaching substrate 1, or prior to reaching ta—C growing on the substrate. The optimal ion energy window for ta—C layer 7 formation in the FIGS. 1 and 2 embodiments is from about 100-200 eV (preferably from about 100-150 eV, and most preferably from about 100-140 eV) per carbon ion. At these energies, films 7 (i.e. layer 3 in the FIG. 2 embodiment) emulate diamond.

However, compressive stresses can develop in ta—C when being deposited at 100-150 eV. Such stress can reach as high as 10 Gpa and can potentially cause delamination from many substrates. It has been found that these stresses can be controlled and decreased by increasing the ion energy the deposition process to a range of from about 200-1,000 eV. The plasma ion beam source enables ion energy to be controlled within different ranges in an industrial process for large area deposition utilized herein. The compressive stress in amorphous carbon is thus decreased significantly at this higher ion energy range of 200-1,000 eV.

High stress is undesirable in the thin interfacing portion 8 of coating 3 that directly contacts the surface of a glass substrate 1. Thus, for example, the first 1-40% thickness (preferably the first 1-20% and most preferably the first 5-10% thickness) 8 of coating 3 is deposited on substrate 1 using high anti-stress energy levels of from about 200-1,000 eV, preferably from about 400-500 eV. Then, after this initial interfacing portion 8 of coating 3 has been grown, the ion energy in the ion deposition process is decreased (either quickly or gradually while deposition continues) to about 100-200 eV, preferably from about 100-150 eV, to grow the remainder ta—C layer 7 of coating 3.

For example, assume for exemplary purposes only with reference to FIG. 1 that DLC coating 3 is 100 Å thick. The first 10 Å layer 8 of coating 3 (i.e. interfacing portion 8) may be deposited using an ion energy of from about 400 to 500 eV so that layer 8 of coating 3 that contacts the surface of substrate 1 has reduced compressive stresses relative to the remainder 7 of coating 3. Interfacing portion 8 of coating 3 at least partially subimplants into the surface of substrate 1 to allow intermixing with the glass surface. In certain embodiments, only C ions are used in the deposition of interfacing layer 8, with the graded composition interface being mainly SiC. This interface 8 between substrate 1 and coating 3 improves adhesion of coating 3 to substrate 1 and the gradual composition change distributes strain in the interfacial region instead of narrowly concentrating it. Layer 8 of DLC coating 3 may or may not have a density of at least about 2.4 grams per cubic centimeter in different embodiments, and may or may not have at least about 35%, 70%, or 80% $sp^3$ carbon-carbon bonds in different embodiments. After the first 10 Å (i.e. layer 8) of coating 3 has been deposited, then the ion energy is gradually or quickly decreased to 100 to 150 eV for the remainder [may be either ta—C or ta—C:H] 7 of coating 3 so that layer 7 has a higher density and a higher percentage of $sp^3$ C—C bonds than layer 8.

Thus, in certain embodiments, because of the adjustment in ion energy during the deposition process, ta—C coating 3 in FIGS. 1-3 has different densities and different percentages of $sp^3$ C—C bonds at different areas therein. However, at least a portion of coating 3 is a highly tetrahedral ta—C layer 7 having a density of at least about 2.4 grams per cubic centimeter and at least about 35% $sp^3$. The highly tetrahedral ta—C portion is the portion furthest from substrate 1 in FIG. 1, but may optionally be at other areas of coating 3. In a similar manner, the portion of coating 3 having a lesser percentage of $sp^3$ C—C bonds is preferably the portion immediately adjacent substrate 1 (e.g. interfacing layer 8).

In certain embodiments, $CH_4$ may be used as a feedstock gas during the deposition process instead of or in combination with the aforesaid $C_2H_2$ gas.

Referring to FIG. 8, it is noted that the surface of a glass substrate has tiny cracks or microcracks defined therein. These cracks may weaken glass by orders of magnitude, especially when water seeps therein and ruptures further bonds. Thus, another advantage of this invention is that in certain embodiments amorphous carbon atoms and/or networks of layer 7 or 8 fill in or collect in these small cracks because of the small size of carbon atoms (e.g. less than about 100 pm radius atomic, most preferably less than about 80 pm, and most preferably about 76.7 pm) and because of the ion energy of 200 to 1,000 eV, preferably about 400-500 eV, and momentum. This increases the mechanical strength of the glass. The nano cracks in the glass surface shown in FIG. 8 may sometimes be from about 0.4 nm to 1 nm in width. The inert nature and size of the carbon atoms in these nonocracks will prevent water from attacking bonds at the crack tip 14 and weakening the glass. The carbon atoms make their way to positions adjacent the tips 14 of these cracks, due to their size and energy. Tips 14 of these cracks are, typically, from about 0.5 to 50 nm below the glass substrate surface. The top surface of layers 7 and/or remains smooth and/or approximately flat within about less than 1.0 nm even above the cracks.

Carbon is now described generally, in many of its forms, to aid in the understanding of this invention.

Carbon has the ability to form structures based on directed covalent bonds in all three spatial dimensions. Two out of the six electrons of a carbon atom lie in the 1s core and hence do not participate in bonding, while the four remaining 2s and 2p electrons take part in chemical bonding to neighboring atoms. The carbon atom's one 2s and three 2p electron orbitals can hybridise in three different ways. This enables carbon to exist as several allotropes. In nature, three allotropic crystalline phase exists, namely diamond, graphite and the fullerenes and a plethora of non-crystalline forms.

For the diamond crystalline allotrope, in tetrahedral or $sp^3$ bonding all the four bonding electrons form $\sigma$ bonds. The space lattice in diamond is shown in FIG. 4 where each carbon atom is tetrahedrally bonded to four other carbon atoms by $\sigma$ bonds of length 0.154 nm and bond angle of 109° 53". The strength of such a bond coupled with the fact that diamond is a macromolecule (with entirely covalent bonds) give diamond unique physical properties: high atomic density, transparency, extreme hardness, exceptionally high thermal conductivity and extremely high electrical resistivity ($10^{16}$ $\Omega$-cm).

The properties of graphite are governed by its trigonal bonding. The outer 2s, $2p_x$ and $2p_y$ orbitals hybridise in a manner to give three co-planar $sp^2$ orbitals which form $\sigma$ bonds and a p-type $\pi$ orbital $2p_z$ perpendicular to the $sp^2$ orbital plane, as shown in FIG. 5. Graphite consists of hexagonal layers separated from each other by a distance of 0.34 nm. Each carbon atom is bonded to three others by 0.142 nm long $\sigma$ bonds within an hexagonal plane. These planes are held together by weak van der Waals bonding which explains why graphite is soft along the $sp^2$ plane.

As for fullerenes, it is known that $C_{60}$ and $C_{70}$ are the most accessible members of the family of closed-cage molecules called fullerenes, formed entirely of carbon in the $sp^2$ hybridised state. Each fullerenes $C_n$ consists of 12 pentagonal rings and m hexagonal rings such that m=(n−20)/2 (satisfying Euler's Theorem). The $\sigma$ bonds are wrapped such that the fullerene has a highly strained structure and the molecule is rigid.

As for amorphous carbon, there exists a class of carbon in the metastable state without any long range order. Material properties change when using different deposition techniques or even by varying the deposition parameters within a single technique. In this category of materials on one extreme we have ta—C (e.g. layer 7) which is the most diamond-like with up to 90% C—C $sp^3$ bonding in certain preferred embodiments and on the other a-C (amorphous carbon), produced by thermal evaporation of carbon, in which more than 95% graphitic bonds are prevalent. In this respect, these two materials reflect the intrinsic diversity of non-crystalline forms of carbon.

Amorphous materials, such as layer(s) 3, 7 and 8, are metastable solids. In an amorphous solid there exists a set is of equilibrium positions about which atoms oscillate. The atoms in an amorphous material are often extended into a three dimensional network with the absence of order beyond the second nearest neighbor distance.

Referring again to ta—C layer 7, the $sp^3/sp^2$ C—C bonded fraction or percentage (%), e.g. in a vacuum arc deposition technique or techniques used in the '477 patent or deposition techniques discussed above, can be controlled by changing the energy of the incident $C^+$ ions. The films deposited being metastable in nature are under high compressive stress. The $sp^2$ hybridised carbon atoms are clustered and embedded within a $sp^3$ matrix. The extent of the latter bonding confers onto ta—C its diamond-like physical properties. The fraction of the $sp^2$ hybridised atoms determines the extent of clustering. The degree of clustering, which is seen as a strain relief mechanism, implies that the $\pi$ and $\pi^*$ states become delocalised to such an extent that they control the electronic and optical properties of the films. At high density of states, the $\pi$ bands merge with the $\sigma$ states to form the conduction and valence mobility band-edges. Their lower density tail states are localised giving a pseudo-gap. The term "tetrahedral amorphous carbon (ta—C)" is thus used to distinguish this highly tetrahedral material from other "diamond-like carbon" which have C—C correlations mostly of the $sp^2$ type.

The $sp^3$ bonding in coatings 3 is believed to arise from a densification process under energetic ion bombardment conditions. Hybridisation of the carbon atom is expected to adjust to the local density, becoming more $sp^3$ if the density is high and more $sp^2$ if low. This can occur if an incident ion penetrates the first atomic layer and then enters an interstitial subsurface position. The local bonding then reforms around this atom and its neighbours to adopt the most appropriate hybridisation. High energy ions in principle can penetrate the surface layer of the substrate or growing DLC, increase the density of deeper layers which then forces $sp^3$ bonding. Ions of lower energy than the penetration threshold only append to the surface forming $sp^2$ bonded a-C.

Coated articles according to any of the aforesaid embodiments may be used, for example, in the context of automotive windshields, automotive back windows, automotive side windows, architectural glass, IG glass units, is residential or commercial windows, and the like.

In any of the aforesaid embodiments, a layer of non-porous tungsten disulfide ($WS_2$) 12 may be provided on top of layer 7 to prevent the DLC from burning off upon exposure to air if taken to high temperatures after the coating deposition. Layer 12 (e.g. see FIG. 8) may be applied by plasma spraying to a thickness of from about 300 to 10,000 Å. $WS_2$ layer 12 is removeable in certain embodiments. Other suitable materials may instead be used for layer 12.

Once given the above disclosure, many other features, modifications, and improvements will become apparent to the skilled artisan. Such other features, modifications, and improvements are, therefore, considered to be a part of this invention, the scope of which is to be determined by the following claims.

I claim:

1. A method of making a coated article, the method comprising:
    having a low-E coating on a glass substrate; and wherein a layer comprising carbon is located over the low-E coating, the layer comprising carbon for protecting the low-E coating, and
    the layer comprising carbon burning off during heat treatment.

2. The method of claim 1, wherein the layer comprising carbon comprises DLC.

3. The method of claim 1, wherein the layer comprising carbon comprises DLC and has an average density of at least 2.4 gm/cm3.

4. The method of claim 1, wherein the layer comprising carbon further includes hydrogen.

5. The method of claim 1, further comprising using the coated article in a window unit.

6. The method of claim 1, wherein the layer comprising carbon has an average density of at least 2.4 gm/cm3.

* * * * *